United States Patent
Masuda

(10) Patent No.: US 7,826,814 B2
(45) Date of Patent: Nov. 2, 2010

(54) FREQUENCY SYNTHESIZER

(75) Inventor: Toru Masuda, Kokubunji (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 680 days.

(21) Appl. No.: 11/759,716

(22) Filed: Jun. 7, 2007

(65) Prior Publication Data
US 2007/0298750 A1 Dec. 27, 2007

(30) Foreign Application Priority Data
Jun. 9, 2006 (JP) ............... 2006-160734

(51) Int. Cl.
*H04B 7/00* (2006.01)

(52) U.S. Cl. ............. 455/258; 455/255; 455/260; 327/105; 327/117

(58) Field of Classification Search .......... 455/414, 455/425, 456.5, 456.6, 561, 550.1, 575.1, 455/147, 88, 313, 323, 165, 208, 258, 265, 455/255, 259, 260, 318; 327/113, 254, 255, 327/116, 117, 119, 121, 105; 342/111, 102, 342/103, 100; 375/298, 344, 376
See application file for complete search history.

(56) References Cited

U.S. PATENT DOCUMENTS

| | | | |
|---|---|---|---|
| 6,184,817 B1 * | 2/2001 | Koechlin | 342/62 |
| 6,466,064 B2 * | 10/2002 | Kurogouchi et al. | 327/113 |
| 7,085,549 B2 * | 8/2006 | Peterson et al. | 455/323 |
| 7,349,813 B2 * | 3/2008 | Gutierrez et al. | 702/46 |
| 7,450,185 B2 * | 11/2008 | Wu | 348/725 |
| 7,546,102 B2 * | 6/2009 | Widerin | 455/260 |
| 7,751,487 B2 | 7/2010 | Iida | |

| | | |
|---|---|---|
| 2005/0014479 A1 | 1/2005 | Abdellaoui et al. |

(Continued)

FOREIGN PATENT DOCUMENTS

EP  1 677 446 A1  7/2006

(Continued)

OTHER PUBLICATIONS

A Ismail et al., "A 3.1 to 8.2 GHz Direct Conversion Receiver for MB-OFDM UWB Communications", IEEE International Solid-State Circuits Conference, 2005 Collected Papers, lecture No. 11.5, pp. 208-210.

(Continued)

*Primary Examiner*—Duc Nguyen
*Assistant Examiner*—Charles Chow
(74) *Attorney, Agent, or Firm*—Miles & Stockbridge P.C.

(57) ABSTRACT

A frequency synthesizer comprises: a single-tone signal generator which outputs signals of a single frequency; a frequency multiplier which generates one or more intermediate signals having different frequencies based on frequencies of input signals and outputs the same as output signals; a frequency selector; a mixer; and a frequency synthesizer control circuit which includes a frequency synthesizer control terminal, wherein an output of the single-tone signal generator is set as an input of the frequency multiplier, one or more outputs of the frequency multiplier are set as one or more inputs of the frequency selector, an output of the frequency selector and one output of the outputs of the frequency multiplier are set as first and second inputs of the mixer, and an output of the mixer is set as an output of the frequency synthesizer.

11 Claims, 6 Drawing Sheets

U.S. PATENT DOCUMENTS

| | | | |
|---|---|---|---|
| 2005/0143041 A1* | 6/2005 | Lee et al. | 455/313 |
| 2006/0183455 A1* | 8/2006 | Cha et al. | 455/323 |
| 2007/0155350 A1* | 7/2007 | Razavi et al. | 455/147 |
| 2008/0002788 A1* | 1/2008 | Akhtar et al. | 375/298 |
| 2008/0003954 A1* | 1/2008 | Matsuno | 455/88 |
| 2008/0024231 A1* | 1/2008 | Chang et al. | 331/38 |
| 2009/0232246 A1 | 9/2009 | Iida | |

FOREIGN PATENT DOCUMENTS

| | | |
|---|---|---|
| JP | 2005-039827 A | 2/2005 |
| JP | 2005-129993 A | 5/2005 |
| JP | 2005-175698 A | 6/2005 |
| JP | 2005-198304 A | 7/2005 |
| JP | 2006-121546 | 5/2006 |

OTHER PUBLICATIONS

Che Fu Liang et al., "A 14-band Frequency Synthesizer for MB-OFDM UWB Application", IEEE International Solid-State Circuits Conference, 2006 Collected Papers, lecture No. 6.7, pp. 126-128.

Perrott et al., "A 27-mW CMOS Fractional-N Synthesizer Using Digital Compensation for 2.5-Mb/s GFSK Modulation", Dec. 1997, IEEE Journal of Solid-State Circuits, vol. 32, No. 12, pp. 2048-2060.

Cho et al., "A 6.5GHz CMOS FSK Modulator for Wireless Sensor Applications", 2002 Symposium on VLSI Circuits Digest of Technical Papers, pp. 182-185.

* cited by examiner

FREQUENCY SYNTHESIZER

CROSS-REFERENCE TO RELATED APPLICATION

The present application claims priority from Japanese Patent Application No. JP 2006-160734 filed on Jun. 9, 2006, the content of which is hereby incorporated by reference into this application.

TECHNICAL FIELD OF THE INVENTION

The present invention relates to a frequency synthesizer suitably applied to a radio communication circuit in a radio communication system. In particular, it relates to a frequency synthesizer effectively applied to a radio communication circuit and a system in which data are transmitted and received using a wideband multiband.

BACKGROUND OF THE INVENTION

In general, a radio communication system uses a specified frequency band for transmitting and receiving data. For example, in IEEE 802.11g widely known as the U.S. standard for wireless Local Area Network (LAN), the frequency band from 2.4 GHz to 2.47 GHz is used, and the maximum transmission rate of 54 Mbps is attained in a communication distance of 50 to 100 m. However, the demands from general users to data have been increasing year after year, and it has been strongly expected to download music data and High Definition video data as well as High Definition picture data to user's portable equipments in a short time. One of technologies to meet this demand is Ultra Wide Band (UWB) radio communications. As for the UWB radio communications, since the U.S. Federal Communications Commission permitted the commercial use of UWB in April, 2002, many organizations have been promoted its research and development activities.

In such UWB radio communications, descriptions on local oscillation signal generating circuits for the UWB radio communications are found in, for example, A Ismail et. al., "A 3.1 to 8.2 GHz Direct Conversion Receiver for MB-OFDM UWB Communications", (U.S.), IEEE Solid-State Circuits Conference, 2005 Collected Papers, lecture No. 11.5, pp. 208 to 210 (Non-Patent Document 1), C-F. Liang et al., "A 14-band Frequency Synthesizer for MB-OFDM UWB Application, (U.S.), IEEE Solid-State Circuits Conference, 2006 Collected Papers, lecture No. 6.7, pp. 126 to 128 (Non-Patent Document 2), Japanese Patent Application Laid-Open Publication No. 2005-175698 (Patent Document 1), Japanese Patent Application Laid-Open Publication No. 2005-198304 (Patent Document 2), Japanese Patent Application Laid-Open Publication No. 2005-129993 (Patent Document 3), Japanese Patent Application Laid-Open Publication No. 2005-39827 (Patent Document 4), and others.

In the Non-Patent Document 1, after an oscillation frequency fREF is generated by a single-tone signal generator using an oscillator configured of a resonant circuit including an inductor and a capacitor that can generate four-phase signal, signals of a plurality of frequencies are generated by use of a plurality of divide-by-2 frequency divider circuits and Single Sideband Mixers (SSB Mixers).

In the Non-Patent Document 2, two single-tone signal generators are disposed, and a frequency of an integral multiple of 528 MHz and a frequency of a decimal multiple thereof are generated simultaneously, and then, three SSB mixers are used simultaneously to repeat adding and subtracting of frequencies, thereby generating a sub-band center frequency.

In the Patent Document 1, in a high speed frequency hopping local generator, a frequency to become reference is generated and divided into four, and then, signals of a plurality of frequencies are generated by use of a plurality of dividers such as a divide-by-5 frequency divider, a divide-by-3 frequency divider, a divide-by-4 frequency divider, and a divide-by-2 frequency divider.

In the Patent Document 2, in a communication system in which data are transmitted and received by use of a UWB formed by including at least two frequency groups consisting of at least two single-tone frequencies, a plurality of single-tone frequencies are generated by use of one local oscillator and one PLL.

In the Patent Document 3, in a frequency synthesizer that synthesizes two or more frequencies to obtain a new frequency, the single-tone frequency is divided by two to obtain a sampling frequency, and further it is divided by two, divided by four, and divided by eight to generate a plurality of frequencies.

In the Patent Document 4, in an SSB generator that generates a carrier wave by use of one local oscillation signal and at least two intermediate frequency signals, group signals formed of signals that have performed phase shift and those have not performed phase shift for each frequency are generated, and one group signal is selected among them and transmitted to the SSB generator.

SUMMARY OF THE INVENTION

Incidentally, with regard to the UWB radio communications as described above, the frequency allocation plan for UWB radio communications using Multiband OFDM (MB-OFDM) method has been proposed for indoor communications in recent years. The frequency allocation plan for UWB radio communications using this MB-OFDM method is shown in FIG. 7. As is apparent from FIG. 7, the UWB is divided into 14 sub-bands from a first sub-band having its bandwidth of 528 MHz with 3432 MHz as its center frequency to a 14th sub-band having its bandwidth of 528 MHz with 10296 MHz as its center frequency. These sub-bands are divided into groups of three sub-bands, and five groups including a group having the first to third sub-bands, a group having the fourth to sixth sub-bands, a group having the seventh to ninth sub-bands, a group having the 10th to 12th sub-bands, and a group having the 13th and 14th sub-bands are formed. The center frequencies of the respective sub-bands are 3432, 3960, 4488, 5016, 5544, 6072, 6600, 7128, 7656, 8184, 8712, 9240, 9768, and 10296 (unit: MHz) in the order from the lowest frequency. A communication network called pico-net can be configured for each group, and at present, means for forming the pico-net by use of the sub-bands of the first group having low frequencies to realize the radio communications has been developed.

However, in order to provide High-speed data-rate wireless communications to more users, it is necessary to increase the number of pico-nets by widely using sub-bands in the UWB band ranging from approximately 3 GHz to approximately 10 GHz. Therefore, in the radio circuit that transmits and receives UWB signals, it is necessary to generate the first to 14th sub-band center frequencies as local oscillation signals for the purpose of demodulation of received signals and modulation of transmission signals. In the local oscillation signals generated by the MB-OFDM method radio circuit, it is necessary that the carrier wave frequency of the signal performs frequency hopping between center frequencies of sub-bands in a short time, and the transit time permitted for the switching of the carrier wave frequencies is defined to be 9.5 ns at maximum. In the conventional frequency switching of the local oscillation signals, Phase Locked Loop (PLL) has been used. However, since the PLL method is established by configuring a feedback loop, it has a disadvantage that the frequency switching time of local oscillation signal is as long as several ms. From the above background, it is necessary to develop the technology to generate local oscillation signals for UWB radio communications over a wide frequency range.

Generating circuits of such local oscillation signals for the UWB radio communications are described in the Non-Patent Documents 1 and 2 and the Patent Documents 1 to 4.

In the Non-Patent Document 1, after the oscillation frequency fREF is generated by a single-tone signal generator, frequencies from fREF (4/64) at minimum to fREF (76/64) at maximum can be generated by use of a plurality of divide-by-2 frequency divider circuits and single sideband mixers. However, even in the case where fREF is set at 16896 MHz in consideration of sub-band center frequencies for UWB radio communications, there are only three frequencies among many generated frequencies, which correspond to the sub-band center frequencies in FIG. 7, i.e., 3432, 3960, and 4488 MHz. Accordingly, it has a disadvantage that it is not possible to widely cover the frequency band shown in FIG. 7.

Further, the structure of the Non-Patent Document 1 is based on the assumption that the single-tone signal generator output is four-phase output, but this structure has a problem as a local oscillation signal generating circuit. Of the technological items required for the local oscillation signal generating circuit, in particular, (1) a sine wave signal of a desired frequency range should be provided without spurious components and (2) an output signal should be of low noise, are important. The noise of the output signal can be considered as phase noise when considered in the frequency range, and the value thereof must be low. According to the Non-Patent Document 1, in the single-tone signal generator that determines the signal quality of the local oscillation signal generating circuit, in order to obtain four-phase output signals whose phases are relatively 0 degrees, 90 degrees, 180 degrees, and 270 degrees, a four-phase output oscillation circuit is used.

FIG. 8 shows an example of a four-phase output oscillation circuit. Further, FIG. 9 shows an example of a two-phase (differential) output oscillation circuit. The phase noise has the same concept as general noises, and as the number of active elements that generate noises increases, the total noise increases. Therefore, when the four-phase output oscillation circuit shown in FIG. 8 is compared under conditions where current consumption is equal, it is qualitatively clear that phase noise thereof is deteriorated more than that of the two-phase output oscillation circuit. Further, although it is possible to increase bias current and make large oscillation amplitude, thereby suppressing the phase noise, the power consumption is further increased in the four-phase output oscillation circuit which originally requires twice the bias current of the conventional two-phase output type. According to the examinations described above, it is important to produce a high-purity signal with few phase noises for the output signal of the single-tone signal generator of a frequency synthesizer, and for this purpose, even when the output type of the single-tone signal generator is the differential type, the structure of a frequency synthesizer that can generate signals of desired frequency is indispensable.

Further, in the Non-Patent Document 2, a frequency of an integral multiple of 528 MHz and a frequency of a decimal multiple thereof are generated at the same time, and then adding and subtracting in frequencies are repeated, thereby generating first to 14th sub-band center frequencies shown in FIG. 7. On the other hand, since it is necessary to use two units of single-tone signal generators, the power consumption and the chip area increase, and also, since all the three stages of SSB mixer must be operated when generating UWB sub-band center frequencies on the high frequency side, the power consumption further increases. As another problem, since the mixer has three stages connected in series, many unnecessary spurious frequencies occur around the output frequency due to spurious by nonlinear operations of the mixer. Therefore, it is expected to develop the technology to increase the purity of output signals and generate local oscillation signals for UWB radio communications with low current consumption.

Accordingly, the present invention has been made to overcome the above-mentioned problems in the prior art, and an object of the present invention is to provide a method capable of achieving the reduction in phase noise and power consumption at the same time, in a structure for generating local oscillation signals used in the ultra wide band.

The above and other objects and novel characteristics of the present invention will be apparent from the description of this specification and the accompanying drawings.

The typical ones of the inventions disclosed in this application will be briefly described as follows.

In order to achieve the object described above, a frequency synthesizer according to the present invention comprises: a single-tone signal generator which outputs signals of a single frequency; a frequency multiplier which generates one or more intermediate signals having different frequencies based on frequencies of input signals and outputs the same as output signals, and controls output or output stop of the intermediate signal by a frequency multiplier control signal; a frequency selector which includes one or more input terminal and outputs an input signal selected by a frequency selector control signal; a mixer which performs frequency mixing to two input signals and generates an output signal; and a frequency synthesizer control circuit which includes a frequency synthesizer control terminal, wherein an output of the single-tone signal generator is set as an input of the frequency multiplier, one or more outputs of the frequency multiplier are set as one or more inputs of the frequency selector, an output of the frequency selector and one output of the outputs of the frequency multiplier are set as first and second inputs of the mixer, and an output of the mixer is set as an output of the frequency synthesizer.

By combining the frequency multiplier, the frequency selector and the mixer in the above-described manner, it is possible to provide a frequency synthesizer that outputs signals of frequencies of fREF×(2n+1)/60 (herein n is an optional integer from 3 to 20), in the range from 7/60 to 41/60 with respect to the output frequency fREF of the single-tone signal generator, and it is possible to generate the above-described output frequencies from the differential output single-tone signal generator. Consequently, it is possible to form a wide-band frequency synthesizer with low phase noises, and provide local oscillation signals.

The effects obtained by typical aspects of the present invention will be briefly described below.

According to the present invention, on the basis of a signal-tone signal generator of the differential output type that can realize low phase noises to the four-phase output, a frequency multiplier, a frequency selector and a mixer are configured in combination. By this means, it is possible to provide local oscillation signals corresponding to 14 sub-band center frequencies for UWB communications with low noises and low power consumption.

BRIEF DESCRIPTIONS OF THE DRAWINGS

DESCRIPTIONS OF THE PREFERRED EMBODIMENTS

Embodiments of a frequency synthesizer according to the present invention will be described in more details with reference to the attached drawings. Note that components having the same function are denoted by the same reference symbols throughout the drawings for describing the embodiment, and the repetitive description thereof will be omitted.

First Embodiment

Figure 1:
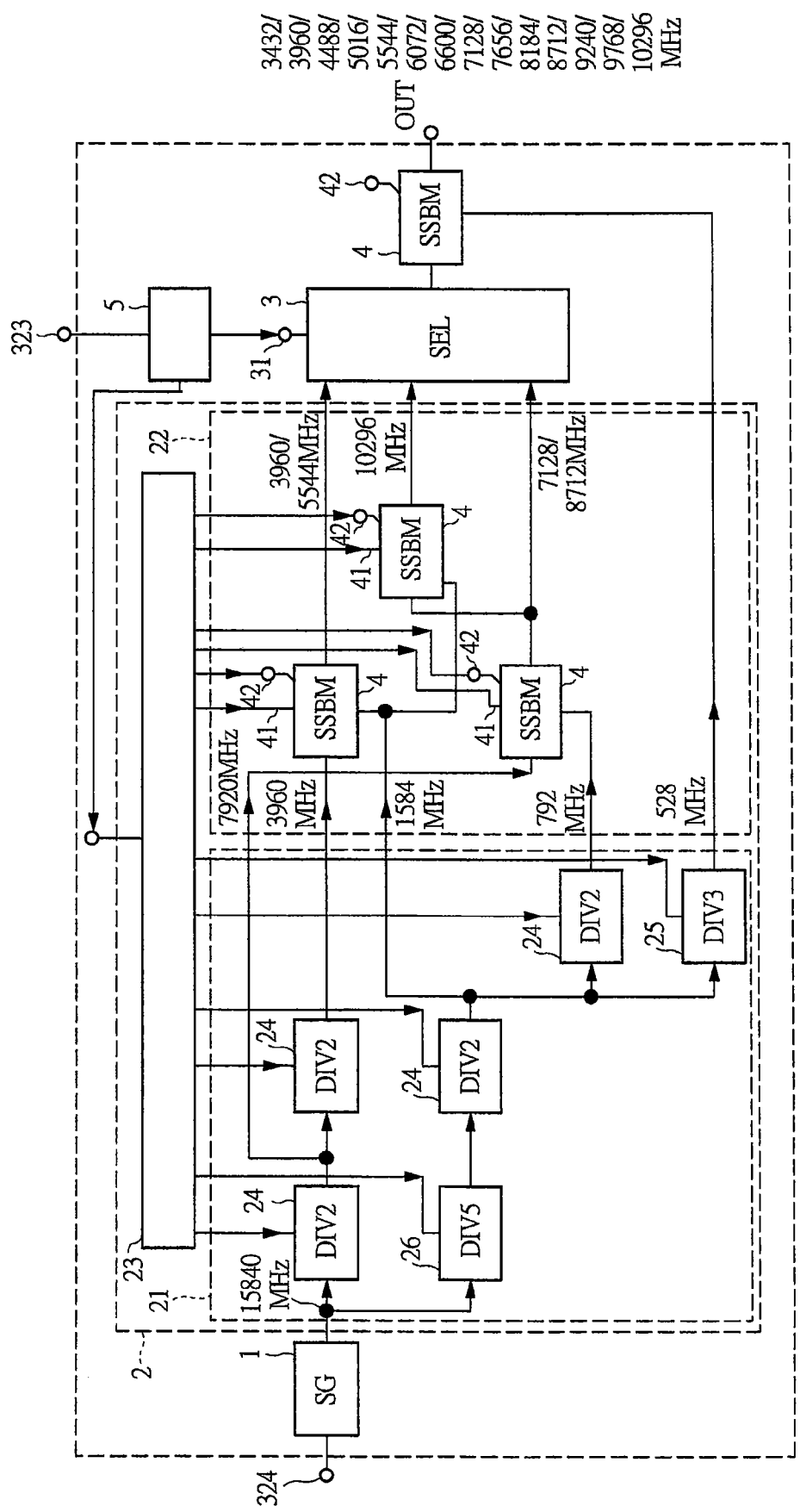
FIG. 1 is a diagram for describing a first embodiment (entire structure) of a frequency synthesizer according to the present invention.

FIG. 1 shows a first embodiment (entire structure) of a frequency synthesizer according to the present invention. The frequency synthesizer shown in FIG. 1 includes: a single-tone signal generator (SG) 1 that outputs signals of a single frequency; a frequency multiplier 2 that generates one or more intermediate signals of different frequencies on the basis of the frequency of input signal and outputs the same as an output signal and controls output or output stop of each intermediate signal by a frequency multiplier control signal; a frequency selector (SEL) 3 that has one or more input terminals and outputs an input signal selected by a frequency selector control signal; a mixer (SSBM) 4 that performs frequency mixing of two input signals to generate an output signal; and a frequency synthesizer control circuit 5 that has a frequency synthesizer control terminal.

In the connection structure of this frequency synthesizer, the output of the single-tone signal generator 1 is set as the input of the frequency multiplier 2, one or more outputs of the frequency multiplier 2 are set as one or more inputs of the frequency selector 3, an output of the frequency selector 3 and one of outputs of the frequency multiplier 2 are set as first and second inputs of the mixer 4, and an output of the mixer 4 is set as the output of the frequency synthesizer. In particular, in this structure, by the control signal inputted to the frequency synthesizer control terminal, the output frequency thereof is controlled, and power source of internal circuits whose operations are unnecessary of the frequency multiplier 2 and the frequency selector 3 can be partially shut down.

In this structure, the single-tone signal generator 1 has two output terminals to output in-phase and out-phase differential signals. Also, a frequency synthesizer reference clock is inputted from a frequency synthesizer reference clock input terminal 324 to the generator 1, and the in-phase and out-phase differential signals are generated at a frequency fREF, and the outputs thereof are connected to differential inputs of the frequency multiplier 2.

The frequency multiplier 2 includes: two input terminals from which in-phase and out-phase differential signals are inputted; four output terminals to output four-phase signals with 90 degree difference for each of one or more types of output signals having different frequencies on the basis of the frequency of the input signal; a frequency divider unit 21 comprising one or more frequency divider circuits each having different frequency dividing numbers; a mixer unit 22 that outputs signals of a frequency generated by adding and subtracting of frequencies by a frequency mixing based on the signals generated by the frequency divider unit 21; and a frequency multiplier control unit 23. In the frequency multiplier 2, on the basis of inputted reference signal, signals of plural frequencies are generated by the frequency divider unit 21, and adding and subtracting of frequencies of the plural signals of the output of the frequency divider unit 21 are performed by a Single Side Band (SSB) mixer disposed in the mixer unit 22 in a latter stage. By this means, the second, fifth, eighth, 11th, and 14th center frequencies among the respective UWB sub-bands are generated and outputted as four-phase signals (having phase differences of 0 degrees, 90 degrees, 180 degrees, and 270 degrees).

The frequency divider unit 21 of this frequency multiplier 2 includes, as frequency divider circuits, four divide-by-2 frequency divider circuits (DIV2) 24, one divide-by-3 frequency divider circuit (DIV3) 25, and one divide-by-5 frequency divider circuit (DIV5) 26. Further, the frequency divider unit 21 has a first path which divides inputted differential input signal by two and outputs four-phase signal thereof (divide-by-2 frequency divider circuit), a second path which divides it by four and outputs four-phase signal thereof (divide-by-2 frequency divider circuit+divide-by-2 frequency divider circuit), a third path which divides it by ten and outputs four-phase signal thereof (divide-by-5 frequency divider circuit+divide-by-2 frequency divider circuit), a fourth path which divides it by twenty and outputs four-phase signal thereof (divide-by-5 frequency divider circuit+divide-by-2 frequency divider circuit+divide-by-2 frequency divider circuit), and a fifth path which divides it by thirty and outputs four-phase signal thereof (divide-by-5 frequency divider circuit+divide-by-2 frequency divider circuit+divide-by-3 frequency divider circuit).

Further, the mixer unit 22 of the frequency multiplier 2 includes three mixers (SSBM) 4, in which a first input terminal of two inputs of the first mixer is connected to an output terminal of the second path and a second input terminal thereof is connected to an output terminal of the third path, an output of the first mixer is set as a first output, a first input terminal of two inputs of the second mixer is connected to an output terminal of the first path and a second input terminal thereof is connected to an output terminal of the fourth path, an output of the second mixer is set as a second output, a first input terminal of two inputs of the third mixer is connected to an output terminal of the second mixer and a second input terminal thereof is connected to the output terminal of the third path, an output of the third mixer is set as a third output, and the fifth path is set as a fourth output.

The frequency selector 3 has one or more sets of four input terminals which input four-phase signal and one output terminal which outputs four-phase signal with 90 degree difference. Also, in the frequency selector 3, of the plural output signals of the frequency multiplier 2, one input signal instructed according to the control signal of the frequency synthesizer control circuit 5 (via selector control terminal 31) is outputted as the output signal of the frequency selector 3 as four-phase signal after performing the amplification and the frequency filtering thereto.

The mixer 4 inputs one optional set of four-phase signal with 90 degree difference of the output of the frequency multiplier 2 and one set of four-phase signal with 90 degree difference of the output of the frequency selector 3, and it outputs its output signal of one set of four-phase signal with 90 degree difference from four output terminals. More specifically, the four-phase signal of the output of the frequency selector 3 is used as RF input signal (frequency fRF), the four-phase signal outputted from the frequency multiplier 2 is used as LO (Local Oscillator) input signal (frequency fLO), and four-phase output obtained through adding and subtracting of frequencies by mixer function is outputted as IF input signal (frequency fIF), and this output is set as the output signal of the frequency synthesizer. In the mixer 4, as the mixer function thereof, there are three operation modes, that is, addition of frequencies (fRF+fLO), subtraction of frequencies (fRF−fLO), and attenuation of LO signal and pass-through and output of only RF signal (fRG), and the control thereof is performed by the signal applied to the mixer output frequency control terminal 42.

The frequency synthesizer control circuit 5 is configured of a logic circuit, and it controls the operation states of the frequency multiplier control unit 23 in the frequency multiplier 2, the frequency selector 3, and the mixer 4 by the frequency synthesizer control signal applied to the frequency synthesizer control terminal 323 and outputs the signal of frequency determined by the frequency synthesizer control signal as an output of the frequency synthesizer.

In the frequency synthesizer configured as described above, by combining the frequency multiplier 2, the frequency selector 3 and the mixer 4, it is possible to output signals of frequencies of fREF×(2n+1)/60 (herein n is an optional integer from 3 to 20), in the range from 7/60 to 41/60 with respect to the output frequency fREF of the single-tone signal generator 1. At this moment, a plurality of sub-bands are divided into a plurality of band groups for each specified number of sub-bands, and one band group is selected from the plurality of band groups in a former stage of the frequency selector, and one sub-band is selected from the selected one band group in a latter stage of the frequency selector. Further, the band group has a center sub-band and upper and lower sub-bands, and the upper and lower sub-bands are sorted from the center sub-band in the latter stage of the frequency selector and the first to 14th sub-bands are generated and outputted.

Hereinafter, the operation of the frequency synthesizer will be described in detail with reference to frequency values shown in FIG. 1.

The single-tone signal generator 1 generates a differential signal of frequency of 15840 MHz. Although the four-phase signal is transmitted in the frequency multiplier 2 and the frequency selector 3 as described above, the differential output is employed in the single-tone signal generator 1 in the structure of the present invention. This shows that, when the oscillator configuring the single-tone signal generator 1 is an LC resonant oscillator using resonant circuits formed of inductor and capacitor, if oscillation circuit structure of four-phase output is used instead of that of differential output, phase noises to be an index of purity of output signal are increased in comparison with that of the oscillation circuit structure of differential output. Therefore, from the viewpoint of reducing the noises in the output signal of the frequency synthesizer, differential output is employed in the single-tone signal generator 1.

In the frequency divider unit 21 of the frequency multiplier 2, the input signal of 15840 MHz is divided as shown in the structure in FIG. 1 by use of one or more frequency divider circuits such as divide-by-2 frequency divider circuits 24, a divide-by-3 frequency divider circuit 25, and a divide-by-5 frequency divider circuit 26. In this structure, it is possible to generate signals having frequencies of 7920 MHz (divide by 2), 3960 MHz (divide by 2+divide by 2), 1585 MHz (divide by 5+divide by 2), 792 MHz (divide by 5+divide by 2+divide by 2), and 528 MHz (divide by 5+divide by 2+divide by 3). These generated signals are, by selecting known four-phase output circuit structure in the frequency divider circuit, inputted as four-phase signal outputs to the mixer unit 22 of the frequency multiplier 2 in the subsequent stage.

In the mixer unit 22, center frequencies of UWB sub-band are generated by use of three mixers. In the first mixer, 3960 MHz is an RF input, 1584 MHz is an LO input, and by changing the mixer output frequency control signal to be applied to the mixer output frequency control terminal 42, a pass-through output of RF signal frequency and a signal obtained by the frequency addition of the RF signal and the LO signal are set as mixer outputs, and thus, 3960 MHz of UWB sub-band #2 and 5544 MHz of UWB sub-band #5 can be outputted. Further, in the second mixer, 7920 MHz is an RF input, 792 MHz is an LO input, and by changing the mixer output frequency control signal to be applied to the terminal 42 in the same manner, signals obtained by the frequency addition and subtraction of the RF signal and the LO signal are set as mixer outputs, and thus, 7128 MHz of UWB sub-band #8 and 8712 MHz of UWB sub-band #11 can be outputted. With regard to 10296 MHz of UWB sub-band #14, the output frequency of the second mixer is set at 8712 MHz, the signal thereof is used as RF input of the third mixer, and 1585 MHz is used as LO input, and then, by adding the frequencies by changing the mixer output frequency control signal to be applied to the terminal 42 in the same manner, the signal of 10296 MHz can be outputted. The signal of 528 MHz generated in the frequency divider unit 21 is not used in the mixer unit 22 and is directly set as one four-phase output of the outputs of the frequency multiplier 2.

The frequency selector 3, in its three four-phase inputs, selects and outputs one of five UWB sub-band frequencies appearing in a time-sharing manner by the frequency synthesizer control signal based on the selector control signal to be applied to the terminal 31.

Figure 7:
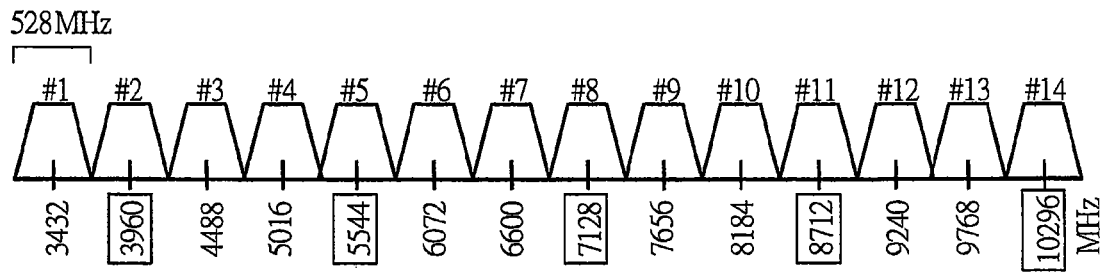
FIG. 7 is a diagram for describing a frequency allocation plan for UWB radio communications using MB-OFDM method.
Figure 8:
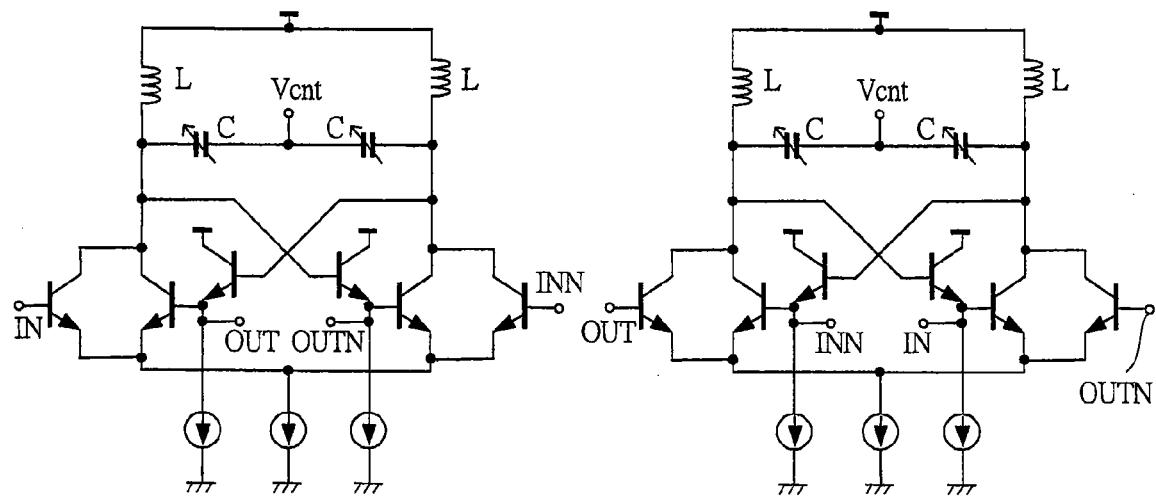
FIG. 8 is a diagram for describing a circuit structure of a four-phase output oscillation circuit.
Figure 9:
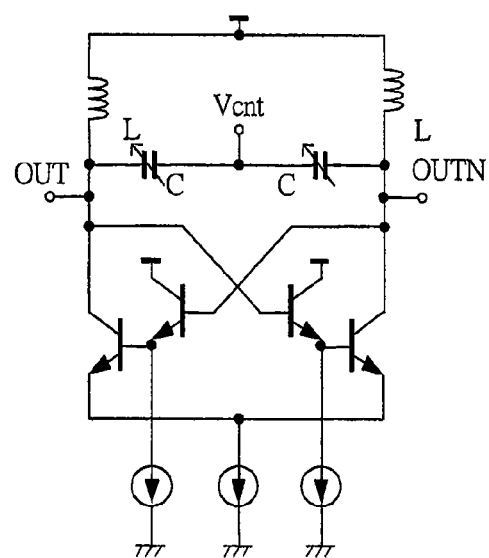
FIG. 9 is a diagram for describing a circuit structure of a two-phase output oscillation circuit.

The mixer 4 inputs four-phase input signals of central frequencies of the UWB sub-bands #2, #5, #8, #11, and #14 selected by the frequency selector 3 as RF input signals and also inputs the four-phase output signal of 528 MHz as an LO input signal among the signals outputted from the frequency multiplier 2, and it outputs a four-phase output obtained by frequency mixing of the signals as a mixer output. As the mixer output signal, the signal of the frequency of (fRF+fLO, fRF, fRF−fLO) can be outputted based on the mixer output frequency control signal to be applied to the mixer output frequency control terminal 42. At this moment, the frequency of LO signal is set at 528 MHz, and this frequency is equal to 528 MHz as the step frequency between center frequencies of the UWB sub-bands. Therefore, in the mixer 4, frequencies of #1 and #3 in the case where RF input frequency is the center frequency of UWB sub-band #2, frequencies of #4 and #6 in the case where RF input frequency is the center frequency of UWB sub-band #5, frequencies of #7 and #9 in the case where RF input frequency is the center frequency of UWB sub-band #8, frequencies of #10 and #12 in the case where RF input frequency is the center frequency of UWB sub-band #11, frequencies of #13 in the case where RF input frequency is the center frequency of UWB sub-band #14 can be outputted appropriately based on the control signal of the mixer output frequency control terminal 42. In other words, in the structure of the frequency synthesizer shown in FIG. 1, all the 14 bands of the UWB sub-bands shown in FIG. 7 can be outputted.

Advantages obtained by the structure of the present embodiment will be described below. The advantages of the present embodiment are, in addition to that all the UWB sub-bands can be covered, (1) as the output type of the single-tone signal generator, the differential type where the phase noise characteristics are preferable can be applied, and (2) on the basis of the frequency synthesizer control signal, by the frequency multiplier output signal and the frequency selector control signal, the power of circuits unnecessary for the generation of the frequency synthesizer output frequencies is shut down, power consumption in the components which varies depending on the value of output frequency can be reduced. Since the two advantages can be achieved, the present embodiment has advantages over the prior art (for example, the Non-Patent Documents 1 and 2).

Second Embodiment

Figure 2:
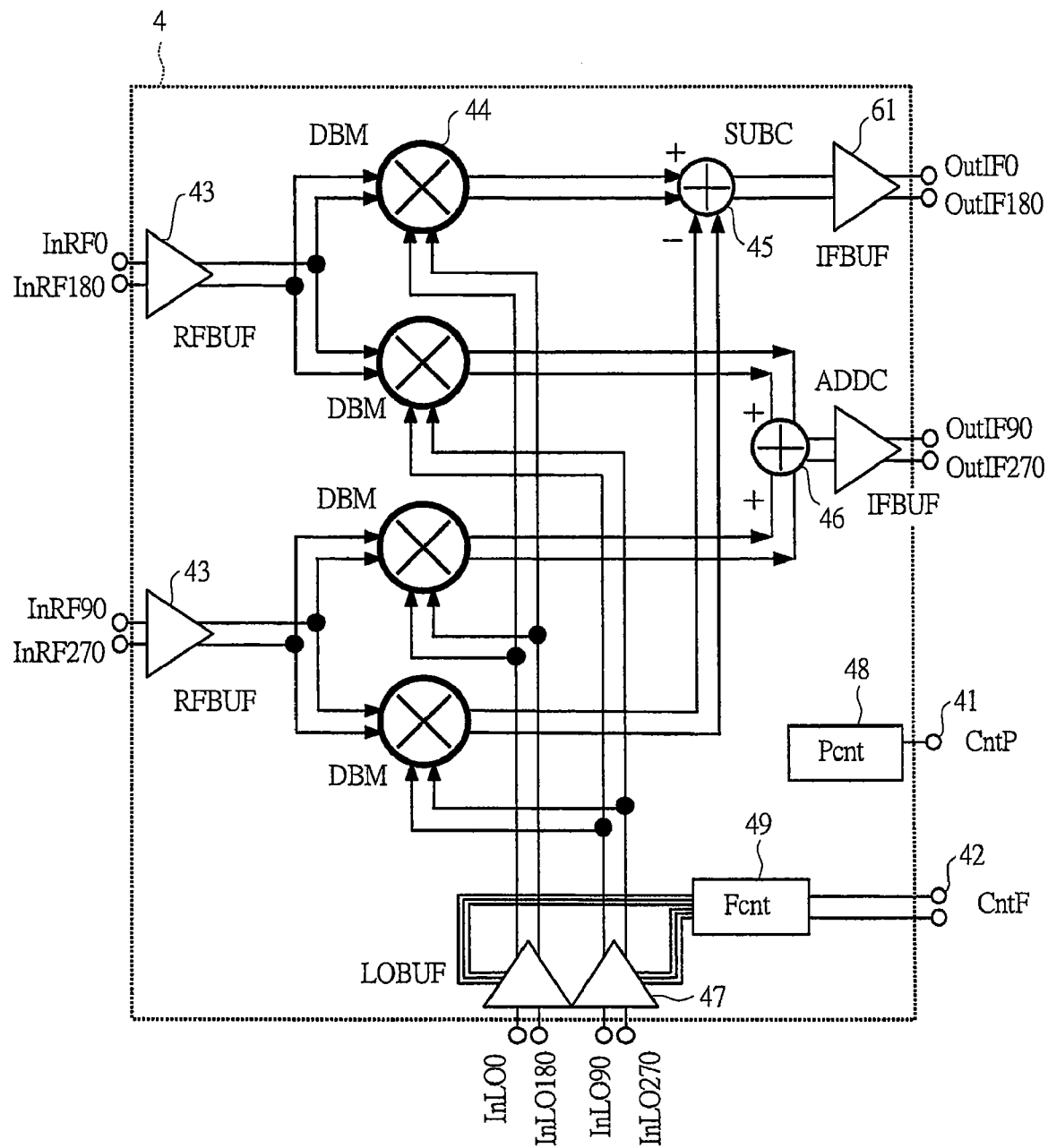
FIG. 2 is a diagram for describing a second embodiment (mixer structure) of a frequency synthesizer according to the present invention.

FIG. 2 shows a second embodiment (mixer structure) of a frequency synthesizer according to the present invention. A mixer 4 shown in FIG. 2 corresponds to a mixer disposed in the last stage of the frequency synthesizer and each of mixers in the mixer unit 22 of the frequency multiplier 2. In accordance with the four-phase signal, the mixer 4 is configured of four first input terminals (InRF0, InRF180, InRF90, and InRF270), four second input terminals (InLO0, InLO180, InLO90, and InLO270), four first output terminals (OutIF0, OutIF180, OutIF90, and OutIF270), one mixer power source control terminal (CntP) 41, one mixer output frequency control terminal (CntF) 42, two RF input buffer circuits (RFBUF) 43, two LO input buffer circuits (LOBUF) 47, four double balanced mixers (DBM) 44, one adder (ADDC) 46, one subtractor (SUBC) 45, two IF output buffer circuits (IFBUF) 61, one power source control circuit (Pcnt) 48, and one mixer output frequency control circuit (Fcnt) 49.

In this structure of the mixer 4, among the first four-phase inputs (0 degrees, 180 degrees, 90 degrees, and 270 degrees) of the mixer 4, the phase 0 degrees and the phase 180 degrees are set as differential inputs of the first RF input buffer circuit, and the phase 90 degrees and the phase 270 degrees are set as differential inputs of the second RF input buffer circuit, and also, among the second four-phase inputs (0 degrees, 180 degrees, 90 degrees, and 270 degrees) of the mixer 4, the phase 0 degrees and the phase 180 degrees are set as differential inputs of the first LO input buffer circuit, and the phase 90 degrees and the phase 270 degrees are set as differential inputs of the second LO input buffer circuit, and the mixer output frequency control signal is set as the control signal of the mixer output frequency control circuit. Further, the differential outputs of the first RF input buffer circuit are set as RF inputs of the first and second double balanced mixers, and the differential outputs of the second RF input buffer circuit are set as RF inputs of the third and fourth double balanced mixers, and the differential outputs of the first LO input buffer circuits are set as LO inputs of the first and third double balanced mixers, and the differential outputs of the second LO input buffer circuit are set as LO inputs of the second and fourth double balanced mixers. Also, of the two differential inputs of the adder, the first differential input is set as an IF differential output of the second double balanced mixer and the second differential input is set as an IF differential output of the third double balanced mixer, and of the two differential inputs of the subtractor, the first differential input is set as an IF differential output of the first double balanced mixer and the second differential input is set as an IF differential output of the fourth double balanced mixer. Then, four output signals of the respective differential outputs of the adder and the subtractor are connected so as to be four-phase outputs of the respective mixers.

More specifically, four-phase RF input signals are divided into two sets of signals of relative phases 0 degrees and 180 degrees and those of relative phases 90 degrees and 270 degrees and are inputted to the RF input buffer circuits 43 of the differential input/output type, respectively. Similarly, four-phase LO input signals are inputted to the two LO input buffer circuits 47 of the differential input/output type in the same manner as the RF signals.

The LO input buffer circuit 47 has three LO input buffer control terminals, and by generating a potential difference about 0.5 V between the first and second control terminals and making the potential of the third control terminal equal to the power source voltage, the phase of the output signal of the LO input buffer circuit 47 can be inverted between the in-phase and the out-phase. Further, by setting the equal potential to the first and second control terminals and making the potential of the third control terminal equal to ground voltage, the output signal of the LO input buffer circuit 47 can be set to a DC potential obtained by the two potentials. The switching of the operation modes (in-phase status, out-phase status, shut-down status for AC signal and output a DC voltage) of the LO input buffer circuit 47 described above is controlled by the mixer output frequency control circuit 49 on the basis of the control signal from the mixer output frequency control terminal 42.

The double balanced mixers 44 input the outputs of the RF input buffer circuits 43 and the LO input buffer circuits 47 and configure an SSB mixer circuit that can perform four-phase output. Signals added and subtracted in frequency by the SSB mixer circuit are added and subtracted by the adder 46 and the subtractor 45, in order to extract only the single side band components of the desired frequency. By combining the differential outputs of the adder 46 and the subtractor 45 and extracting them as the mixer output, the four-phase output of the mixer can be obtained.

Further, the power source control circuit 48 has a function to narrow the bias current in the circuits configuring the mixer to a value as small as several mA on the basis of the control signal from the mixer power source control terminal 41, and an operation mode to reduce the power consumption when the mixer function is turned OFF by this power source control signal can be provided.

Third Embodiment

Figure 3:
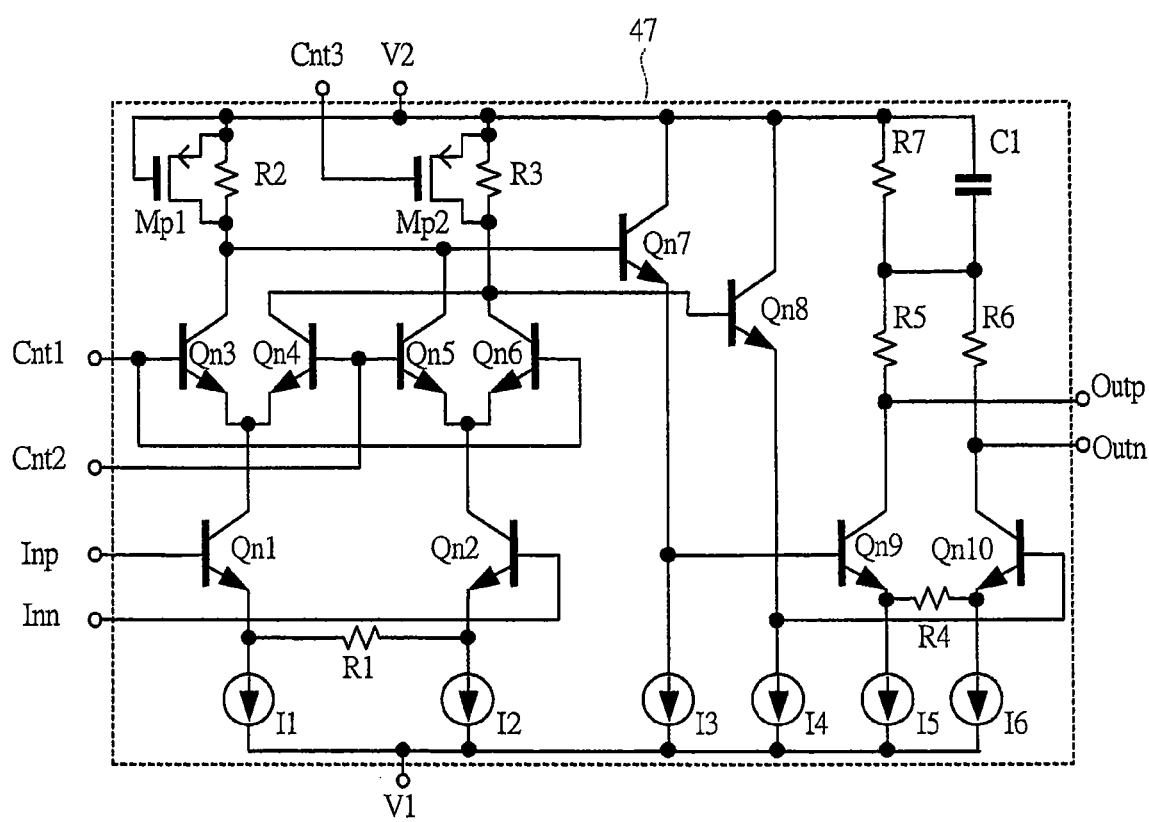
FIG. 3 is a diagram for describing a third embodiment (structure of LO (local oscillator) input buffer circuit) of a frequency synthesizer according to the present invention.

FIG. 3 shows a third embodiment (structure of LO input buffer circuit) of a frequency synthesizer according to the present invention. The LO input buffer circuit 47 shown in FIG. 3 is configured of a bipolar transistor Qn1 whose base is connected to an input terminal Inp and whose emitter is connected to a constant voltage terminal V1 via a constant current source I1, a bipolar transistor Qn2 whose base is connected to an input terminal Inn and whose emitter is connected to a constant voltage terminal V1 via a constant current source I2, a resistor R1 that connects the emitters of the bipolar transistors Qn1 and Qn2, a bipolar transistor Qn3 whose base is connected to a control terminal Cnt1 and whose emitter is connected to a collector of the bipolar transistor Qn1, a bipolar transistor Qn4 whose base is connected to a control terminal Cnt2 and whose emitter is connected to a collector of the bipolar transistor Qn1, a bipolar transistor Qn5 whose base is connected to the control terminal Cnt2 and whose emitter is connected to a collector of the bipolar transistor Qn2, a bipolar transistor Qn6 whose base is connected to the control terminal Cnt1 and whose emitter is connected to the collector of the bipolar transistor Qn2, a resistor R2 whose one terminal is connected in common to collectors of the bipolar transistors Qn3 and Qn5 and whose other terminal is connected to a constant voltage terminal V2, a resistor R3 whose one terminal is connected in common to collectors of the bipolar transistors Qn4 and Qn6 and whose other terminal is connected to the constant voltage terminal V2, a pMOS transistor Mp1 whose gate and source are connected to the constant voltage terminal V2 and whose drain is connected in common to the collectors of the bipolar transistors Qn3 and Qn5, and a pMOS transistor Mp2 whose gate is connected to a control terminal Cnt3 and whose source is connected to the constant voltage terminal V2 and whose drain is connected in common to collectors of the bipolar transistors Qn4 and Qn6.

In addition, it is configured to include a bipolar transistor Qn7 whose base is connected to collectors of the bipolar transistors Qn3 and Qn5 and whose collector is connected to constant voltage terminal V2 and whose emitter is connected to the constant voltage terminal V1 via a constant current source I3, a bipolar transistor Qn8 whose base is connected to the collectors of the bipolar transistors Qn4 and Qn6 and whose collector is connected to constant voltage terminal V2 and whose emitter is connected to the constant voltage terminal V1 via a constant current source I4, a bipolar transistor Qn9 whose base is connected to the emitter of the bipolar transistor Qn7 and whose emitter is connected to the constant voltage terminal V1 via a constant current source I5, a bipolar transistor Qn10 whose base is connected to the emitter of the bipolar transistor Qn8 and whose emitter is connected to the constant voltage terminal V1 via a constant current source I6, a resistor R4 that connects the emitters of the bipolar transistors Qn9 and Qn10, resistors R5 and R6 whose one terminals are connected to the collectors of the bipolar transistors Qn9 and Qn10 and whose other terminals are connected in common, and a parallel circuit of a resistor R7 and a capacitor C1 that connects the common terminal of the resistors R5 and R6 and the constant voltage terminal V2.

In the structure of this LO input buffer circuit 47, the collectors of the bipolar transistors Qn9 and Qn10 are set as output terminals Outp and Outn, respectively, and the phases of signals appearing in the output terminals Outp and Outn are inverted by the potential difference of the voltages to be applied to the control terminals Cnt1 and Cnt2. Also, in the case where the voltages to be applied to the control terminals Cnt1 and Cnt2 are made equal and the potential difference between the DC voltage to be applied to the control terminal Cnt3 and the voltage of the constant voltage terminal V2 is set so as to exceed the threshold voltage of the PMOS transistor Mp2, the signals appearing in the output terminals Outp and Outn are controlled so as to be DC voltages of different values.

More specifically, this LO input buffer circuit 47 is configured of an input stage that performs phase inversion and signal attenuation of input signals by the values of DC voltages to be applied to the control terminals Cnt1, Cnt2 and Cnt3 and an output stage that sets an output signal level. This LO input buffer circuit 47 inputs an in-phase input Inp and an out-phase input Inn and outputs an in-phase output Outp and an out-phase output Outn.

The input stage is configured of a differential input circuit in which emitters of npn-type (hereinafter omitted) transistors Qn1 and Qn2 are coupled via a resistor R1, transistors Qn3 to Qn6 that have a function to invert and not to invert the phases of signal currents appearing in the collectors of the transistors Qn1 and Qn2 by the potential difference between the control terminals Cnt1 and Cnt2, and load resistors R2 and R3. The p-type MOS transistor (hereinafter, referred to as pMOS transistor) Mp2 has a function to switch the potentials at both ends of the load resistor R3 between open and short circuit depending on whether the potential of the control terminal Cnt3 is maximum voltage V2 or minimum voltage V1. The pMOS transistor Mp1 is provided in order to give the same parasitic capacity as that of the load resistor R3 to the load resistor R2. The signal voltage amplified by the load resistors in the input stage is level-shifted by emitter follower transistors Qn7 and Qn8, and then inputted to the input circuit of the output stage configured of the transistors Qn9 and Qn10 whose emitters are coupled by the resistor R4.

In the case where a potential difference of about 0.5 V is generated between the control terminals Cnt1 and Cnt2 and the potential of the control terminal Cnt3 is made equal to the potential of V2, in the output stage, output amplitude with an amplitude of $2 \times I5 \times R5$ is outputted around the potential determined by the product of the sum of bias currents of the transistors Qn9 and Qn10 and the value of the resistor R7 ($=V2-(I5+I6) \times R7$)) as a center. Herein, it is supposed that $I5=I6$ and $R5=R6$.

On the other hand, in the case where the potentials applied to the control terminals Cnt1 and Cnt2 are made equal and the potential of the control terminal Cnt3 is made equal to the potential of V1, the signal current of the input stage is offset by the common collector of the transistors Qn3 to Qn6, and if circuit elements such as transistors and resistors are created without variations, inputted AC signal is significantly attenuated and outputs of the load resistors R2 and R3 can be considered as DC potential. Further, since only both ends of the load resistor R3 are short-circuited, the base potential of the transistor Qn8 becomes the same potential as that of V2, and the base potential of the transistor Qn7 becomes the potential expressed by $V2-I1 \times R2$. When differential input dynamic ranges of the transistors Qn9 and Qn10 are set smaller than $I1 \times R2$, one of the output transistors Qn9 and Qn10 is in a conductive state and the other thereof is in a cut-off state. Therefore, the value of high potential of the output potential outputs DC potential expressed by ($V2-(2 \times I5 \times R7)$), and the value of low potential thereof outputs DC potential expressed by ($V2-(2 \times I5 \times (R5+R7))$).

The lower limit value VCCmin of the power source voltage at which the LO input buffer circuit 47 can operate (minimum value of voltage obtained by (V2−V1)) is, when the voltage between base and emitter of the transistor in a conductive state (VBE) is 0.8 V and the saturation voltage between collector and emitter (VCEs) is 0.2 V, obtained by the following expression.

$$VCCmin = VCEs + I5 \times R4 + 2 \times VBE$$

That is, if $I5 \times R4$ is 0.3 V, VCCmin is about 2.1 V. Accordingly, it is possible to reduce the power source voltage that affects the power consumption.

Fourth Embodiment

Figure 4:
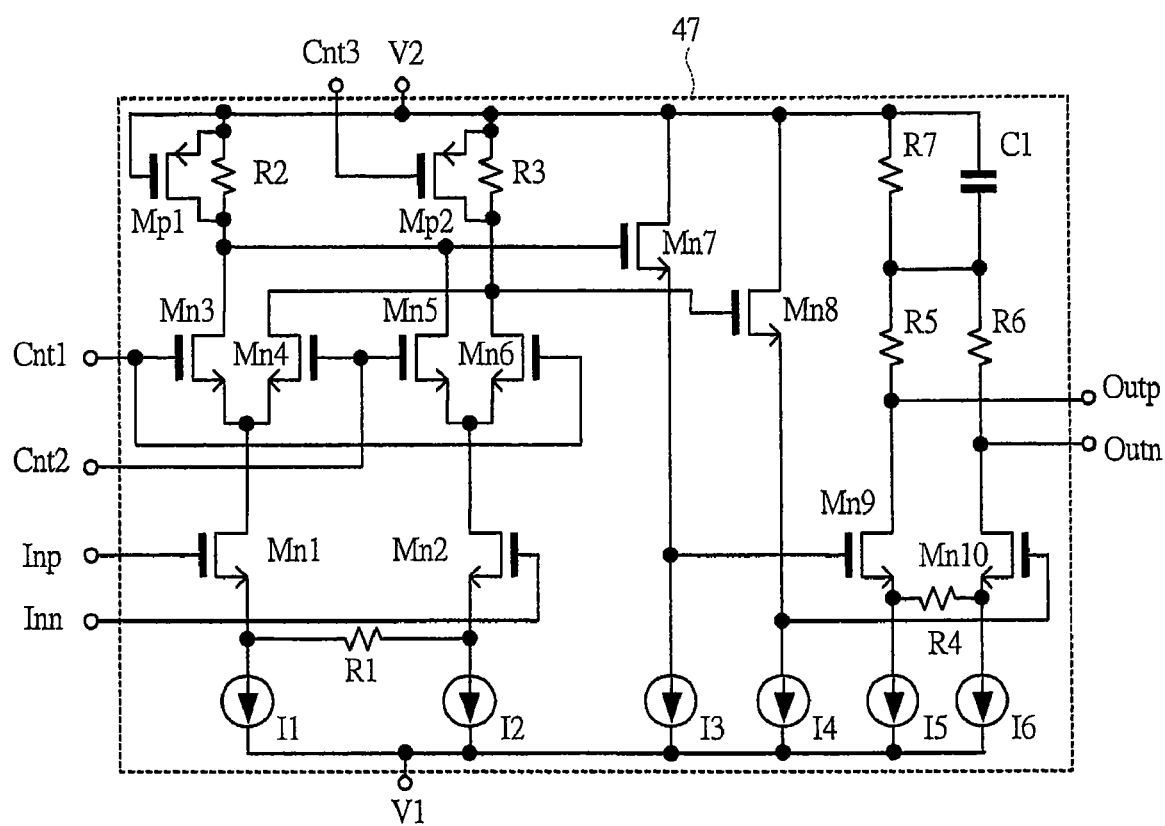
FIG. 4 is a diagram for describing a fourth embodiment (structure of LO input buffer circuit) of a frequency synthesizer according to the present invention.

FIG. 4 shows a fourth embodiment (structure of LO input buffer circuit) of a frequency synthesizer according to the present invention. The circuit structure of the LO input buffer circuit 47 in FIG. 4 is obtained by replacing the transistors in the structure in FIG. 3 from the npn-type bipolar transistors to n-type MOS transistors (hereinafter, referred to as nMOS transistor). The function of the structure in FIG. 4 is the same as that of the structure in FIG. 3, and as an additional advantage thereof, the operation power source voltage can be reduced by adopting this circuit structure.

More specifically, this LO input buffer circuit 47 is configured of an nMOS transistor Mn1, an nMOS transistor Mn2, a resistor R1, an nMOS transistor Mn3, an nMOS transistor Mn4, an nMOS transistor Mn5, an nMOS transistor Mn6, a resistor R2, a resistor R3, a PMOS transistor Mp1, a pMOS transistor Mp2, an nMOS transistor Mn7, an NMOS transistor Mn8, an nMOS transistor Mn9, an NMOS transistor Mn10, a resistor R4, resistors R5 and R6, and a parallel circuit of a resistor R7 and a capacitor C1. In the LO input buffer circuit 47, collectors of the nMOS transistors Qn9 and Qn10 are set as output terminals Outp and Outn, respectively, and the phases of signals appearing in the output terminals Outp and Outn are inverted by the potential difference of voltages to be applied to the control terminals Cnt1 and Cnt2. Also, in the case where the voltages to be applied to the control terminals Cnt1 and Cnt2 are made equal and the potential difference between the DC voltage to be applied to the control terminal Cnt3 and the voltage of the constant voltage terminal V2 is set so as to exceed the threshold voltage of the PMOS transistor Mp2, the signals appearing in the output terminals Outp and Outn are controlled so as to be DC voltages of different values.

The lower limit value VDDmin of the power source voltage at which the LO input buffer circuit 47 can operate (minimum value of voltage obtained by (V2−V1)) is, when the voltage between gate and source of the MOS transistor in a conductive state (VGS) is 0.4 V and the saturation voltage between drain and source (VDSs) is 0.2 V, obtained by the following expression.

$$VDDmin = VDSs + I5 \times R4 + 2 \times VDS$$

That is, if I5×R4 is 0.3 V, VDDmin is about 1.3 V. Accordingly, it is possible to reduce the power source voltage by about 40% in comparison to the case of using bipolar transistors, that is, it is possible to reduce the power consumption.

Fifth Embodiment

Figure 5:
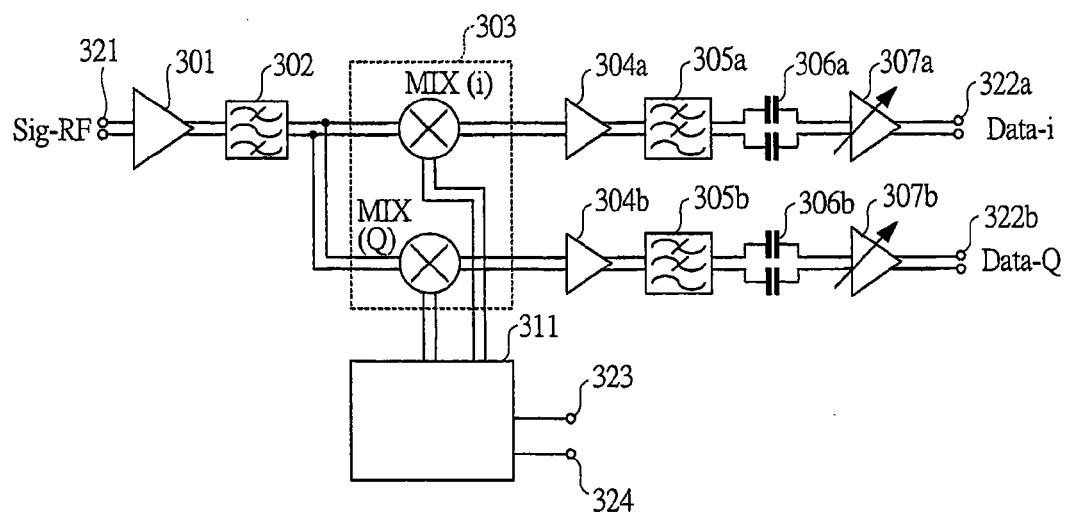
FIG. 5 is a diagram for describing a fifth embodiment of a frequency synthesizer (structure of wireless communication equipment including a frequency synthesizer) according to the present invention.

FIG. 5 shows a fifth embodiment of a frequency synthesizer (structure of wireless communication equipment configured by including a frequency synthesizer) according to the present invention. FIG. 5 shows a wireless communication equipment configured by including a frequency synthesizer of the first to fourth embodiments.

The wireless communication equipment according to the present embodiment is configured as a direct conversion wireless receiver that inputs received signals and converts them directly into low frequency signals. The low frequency signal consists of low frequency signal in-phase components (i phase signal) and low frequency signal orthogonal components (Q phase signal).

This structure includes: a low noise amplifier 301 that amplifies a received signal Sig-RF of frequency RF inputted from an RF input terminal 321; a band-pass filter 302 that removes unnecessary wave of the output signal of the low noise amplifier 301; and a direct conversion mixer 303 that converts the output signal of the band-pass filter 302 into the low frequency signal.

The local oscillation signal generated in the local oscillation signal generating circuit 311 is supplied to the direct conversion mixer 303. The local oscillation signal is composed of two signals whose phases are different by 90 degrees respectively, namely, that are orthogonal to each other. A low frequency signal is outputted as a common output from the direct conversion mixer 303, and low frequency signal in-phase components and low frequency signal orthogonal components are differentially outputted as i signals and Q signals. After the output of the direct conversion mixer 303 is amplified by amplifiers 304a and 304b, unnecessary waves thereof are removed by low band-pass filters 305a and 305b, and then, the output is amplified again by variable gain amplifiers 307a and 307b after passing through interstage capacitors 306a and 306b. From the variable gain amplifiers 307a and 307b, signals of both i/Q phases, that is, Data_i and Data_Q are outputted to IF output terminals 322a and 322b.

The local oscillation signal generating circuit 311 is configured of a frequency synthesizer of the present invention selected from the frequency synthesizers according to the first to fourth embodiments. By this means, in the wireless communication equipment, input signals of wide frequency range can be received and local oscillation signal with low phase noise can be generated. Therefore, it is possible to improve the discrimination sensitivity of the received data.

Sixth Embodiment

Figure 6:
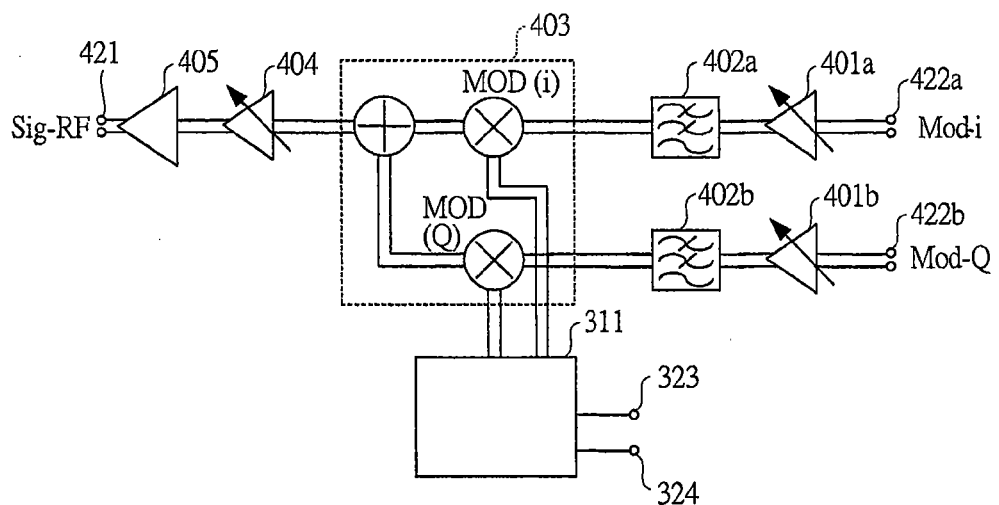
FIG. 6 is a diagram for describing a sixth embodiment of a frequency synthesizer (structure of wireless communication equipment including a frequency synthesizer) according to the present invention.

FIG. 6 shows a sixth embodiment of a frequency synthesizer (structure of wireless communication equipment configured by including a frequency synthesizer) according to the present invention. FIG. 6 shows another wireless communication equipment configured by including a frequency synthesizer of the present invention selected from those of the first to fourth embodiments.

The wireless communication equipment according to the present embodiment is configured as a direct conversion wireless transmitter that directly converts modulation signal Mod_i (modulation signal in-phase component) and modulation signal Mod_Q (modulation signal orthogonal component) to be inputted to transmission signal Sig-RF of a radio frequency.

The modulation signals Mod_i and Mod_Q inputted from Mod input terminals 422a and 422b are differentially inputted to the variable gain amplifiers 401a and 401b, respectively. The output signals of the variable gain amplifiers 401a and 401b pass through the low band-pass filters 402a and 402b, and unnecessary waves thereof are removed.

The output signals of the low band-pass filters 402a and 402b are inputted to a direct conversion modulator 403 and are converted into transmission signals. The transmission signals outputted from the direct conversion modulator 403 are amplified by a variable gain amplifier 404 and then amplified by an output amplifier 405, and then, the transmission signal Sig-RF of frequency RF is outputted from an RF output terminal 421.

Also in this transmitter, the local oscillation signal generated by the local oscillation signal generating circuit 311 is supplied to the direct conversion modulator 403. As mentioned above, the local oscillation signal is composed of two signals whose phases are different by 90 degrees respectively, namely, that are orthogonal to each other. Accordingly, also in the present embodiment, since the local oscillation signal generating circuit 311 is configured of a frequency synthesizer of the present invention, output signals of wide frequency range can be received and local oscillation signals with low phase noise can be generated in the wireless communication equipment. Therefore, it is possible to improve the discrimination sensitivity of the transmitted data.

In the foregoing, the invention made by the inventor of the present invention has been concretely described based on the embodiments. However, it is needless to say that the present invention is not limited to the foregoing embodiments and various modifications and alterations can be made within the scope of the present invention.

For example, in the above respective embodiments, it is needless to mention that the effects of the present invention are obtained not only in the case where bipolar transistors or MOS transistors are used, but the similar effects can be obtained also in the case where field effect transistors, hetero junction bipolar transistors, high-electron-mobility transistors, metal semiconductor junction field effect transistors and others are used instead.

Moreover, an npn type transistor has been shown for a bipolar transistor and a CMOS-type circuit structure using p-type and n-type transistors in negative conductance has been shown for MOS transistors. However, it is needless to mention that the similar effects can be obtained even in the case where a pnp-type bipolar transistor is used and a circuit structure in which MOS transistors are replaced with n-type and p-type transistors is used in consideration of polarities of power source voltage.

What is claimed is:

1. A frequency synthesizer comprising:
a single-tone signal generator which outputs signals of a single frequency;
a frequency multiplier which generates one or more intermediate signals having different frequencies based on frequencies of input signals and outputs the same as output signals, and controls output or output stop of the intermediate signal by a frequency multiplier control signal;
a frequency selector which includes one or more input terminals and outputs an input signal selected by a frequency selector control signal;
a mixer which performs frequency mixing to two input signals and generates an output signal; and
a frequency synthesizer control circuit which includes a frequency synthesizer control terminal,
wherein an output of the single-tone signal generator is set as an input of the frequency multiplier,
wherein one or more outputs of the frequency multiplier are set as one or more inputs of the frequency selector,
wherein an output of the frequency selector and one output of the outputs of the frequency multiplier are set as first and second inputs of the mixer,
wherein an output of the mixer is set as an output of the frequency synthesizer,
wherein the frequency multiplier comprises:
a frequency divider unit provided with one or more frequency divider circuits having different frequency dividing numbers; and
a mixer unit which outputs a signal of frequency generated by adding and subtracting of frequencies by frequency mixing based on the signals generated by the frequency divider unit,
wherein the frequency divider unit of the frequency multiplier comprises:
a first path which inputs a differential input signal of the frequency multiplier as its input signal, divides the signal by two, and outputs a four-phase signal thereof;
a second path which inputs a differential input signal of the frequency multiplier as its input signal, divides the signal by four, and outputs a four-phase signal thereof;
a third path which inputs a differential input signal of the frequency multiplier as its input signal, divides the signal by ten, and outputs a four-phase signal thereof;
a fourth path which inputs a differential input signal of the frequency multiplier as its input signal, divides the signal by twenty, and outputs a four-phase signal thereof; and
a fifth path which inputs a differential input signal of the frequency multiplier as its input signal, divides the signal by thirty, and outputs a four-phase signal thereof,
wherein, in the mixer unit of the frequency multiplier,
a first input terminal of two inputs of a first mixer is connected to an output terminal of the second path and a second input terminal thereof is connected to an output terminal of the third path, and an output of the first mixer is set as a first output of the frequency multiplier,
a first input terminal of two inputs of a second mixer is connected to an output terminal of the first path and a second input terminal thereof is connected to an output terminal of the fourth path, and an output of the second mixer is set as a second output of the frequency multiplier, and
a first input terminal of two inputs of a third mixer is connected to an output terminal of the second mixer and a second input terminal thereof is connected to the output terminal of the third path, and an output of the third mixer is set as a third output of the frequency multiplier, and
wherein the fifth path is set as a fourth output of the frequency multiplier.

2. The frequency synthesizer according to claim 1, wherein, by a control signal inputted to the frequency synthesizer control terminal, an output frequency thereof is controlled, and power source of internal circuits whose operations are unnecessary of the frequency multiplier and the frequency selector is partially shut down.

3. The frequency synthesizer according to claim 1, wherein the single-tone signal generator has two output terminals to output in-phase and out-phase differential signals,
wherein the frequency multiplier has two input terminals to input in-phase and out-phase differential signals and four output terminals to output four-phase signal of 90 degree difference for each of one or more types of output signals having different frequencies based on a frequency of input signal,
wherein the frequency selector has one or more sets of four input terminals which inputs four-phase signals and one output terminal to output four-phase signal with 90 degree difference, and
wherein the mixer inputs one optional set of four-phase signal with 90 degree difference of the output of the frequency multiplier and one set of four-phase signal with 90 degree difference of the output of the frequency selector, and outputs one set of four-phase signal with 90 degree difference as its output signal from four output terminals.

4. The frequency synthesizer according to claim 1, wherein the mixer and all mixers configuring the mixer unit of the frequency multiplier comprise:
first and second input terminals;
first output terminals; and
a mixer output frequency control terminal, wherein four first input terminals and four second input terminals are provided to input four-phase signals, wherein four first output terminals are provided to output four-phase signals, and wherein, by a control signal applied to the mixer output frequency control terminal, output frequencies of the respective mixers are variable.

5. The frequency synthesizer according to claim 4, wherein the mixer and all mixers configuring the mixer unit of the frequency multiplier comprise:

four double balanced mixers;

two RF input buffer circuits;

two LO input buffer circuits;

two IF output buffer circuits;

one adder;

one subtractor;

one power source control circuit; and one mixer output frequency control circuit, wherein, of the first four-phase inputs (0 degrees, 180 degrees, 90 degrees, 270 degrees) of the respective mixers, phase 0 degree and phase 180 degree are set as differential inputs of a first RF input buffer circuit, and phase 90 degree and phase 270 degree are set as differential inputs of a second RF input buffer circuit, wherein, of the second four-phase inputs (0 degrees, 180 degrees, 90 degrees, 270 degrees) of the respective mixers, phase 0 degree and phase 180 degree are set as differential inputs of a first LO input buffer circuit, and phase 90 degree and phase 270 degree are set as differential inputs of a second LO input buffer circuit, wherein a mixer output frequency control signal of the respective mixers is set as a control signal of the mixer output frequency control circuit, wherein a differential output of the first RF input buffer circuit is set as RF inputs of the first and second double balanced mixers, wherein a differential output of the second RF input buffer circuit is set as RF inputs of the third and fourth double balanced mixers, wherein a differential output of the first LO input buffer circuit is set as LO inputs of the first and third double balanced mixers, wherein a differential output of the second LO input buffer circuit is set as LO inputs of the second and fourth double balanced mixers, wherein, of two differential inputs of the adder, a first differential input is set as an IF differential output of the second double balanced mixer, and a second differential input is set as an IF differential output of the third double balanced mixer, wherein, of two differential inputs of the subtractor, a first differential input is set as an IF differential output of the first double balanced mixer, and a second differential input is set as an IF differential output of the fourth double balanced mixer, and wherein four output signals obtained by combining the respective differential outputs of the adder and the subtractor are set as four-phase outputs of the respective mixers.

6. The frequency synthesizer according to claim 5, wherein, in all the mixers configuring the mixer unit of the frequency multiplier, frequencies obtained by addition (f1+f2) and subtraction (f2−f2) of two types of input frequencies (f1 and f2) and pass-through (f1) are outputted by the mixer output frequency control signal, and wherein current supply necessary for operation is stopped by shutting down power source by a mixer power source control signal.

7. The frequency synthesizer according to claim 5, wherein the first and second LO input buffer circuits have a function to invert phases of signals of differential outputs thereof by an LO input buffer control signal and a function to output only different DC potentials for each of the differential outputs, and wherein the differential outputs are switched among three status of an in-phase status, an out-phase status, and a shut-down status for AC signal and output a DC voltage.

8. The frequency synthesizer according to claim 5, wherein the first and second LO input buffer circuits comprise:

a first bipolar transistor whose base is connected to a first input terminal and whose emitter is connected to a first constant voltage terminal via a first constant current source;

a second bipolar transistor whose base is connected to a second input terminal and whose emitter is connected to the first constant voltage terminal via a second constant current source;

a first resistor which connects the emitters of the first and second bipolar transistors;

a third bipolar transistor whose base is connected to a first control terminal and whose emitter is connected to a collector of the first bipolar transistor;

a fourth bipolar transistor whose base is connected to a second control terminal and whose emitter is connected to the collector of the first bipolar transistor;

a fifth bipolar transistor whose base is connected to the second control terminal and whose emitter is connected to a collector of the second bipolar transistor;

a sixth bipolar transistor whose base is connected to the first control terminal and whose emitter is connected to the collector of the second bipolar transistor;

a second resistor whose one terminal is connected in common to the collectors of the third and fifth bipolar transistors and whose other terminal is connected to a second constant voltage terminal;

a third resistor whose one terminal is connected in common to the collectors of the fourth and sixth bipolar transistors and whose other terminal is connected to the second constant voltage terminal;

a first pMOS transistor whose gate and source are connected to the second constant voltage terminal and whose drain is connected in common to the collectors of the third and fifth bipolar transistors;

a second pMOS transistor whose gate is connected to a third control terminal, and whose source is connected to the second constant voltage terminal, and whose drain is connected in common to the collectors of the fourth and sixth bipolar transistors;

a seventh bipolar transistor whose base is connected to the collectors of the third and fifth bipolar transistors, and whose collector is connected to the second constant voltage terminal, and whose emitter is connected to the first constant voltage terminal via a third constant current source;

an eighth bipolar transistor whose base is connected to the collectors of the fourth and sixth bipolar transistors, and whose collector is connected to the second constant voltage terminal, and whose emitter is connected to the first constant voltage terminal via a fourth constant current source;

a ninth bipolar transistor whose base is connected to the emitter of the seventh bipolar transistor and whose emitter is connected to the first constant voltage terminal via a fifth constant current source;

a tenth bipolar transistor whose base is connected to the emitter of the eighth bipolar transistor and whose emitter is connected to first constant voltage terminal via a sixth constant current source;

a fourth resistor which connects the emitters of the ninth and tenth bipolar transistors;

fifth and sixth resistors whose one terminals are connected to collectors of the ninth and tenth bipolar transistors and whose other terminals are connected in common; and a parallel circuit of a seventh resistor and a first capacitor which connects a common terminal of the fifth and sixth resistors and the second constant voltage terminal, wherein the collectors of the ninth and tenth bipolar transistors are set as first and second output terminals respectively, wherein, by potential difference of voltages to be applied to the first and second control terminals, phases of signals appearing in the first and second output terminals are inverted, and wherein, when voltages to be applied to the first and second control terminals are made equal and potential difference between DC voltage to be applied to the third control terminal and voltage of the second constant voltage terminal is set so as to exceed threshold voltage of the second pMOS transistor, signals appearing in the first and second output terminals become DC voltages of different values.

9. The frequency synthesizer according to claim 5, wherein the first and second LO input buffer circuits comprise:

a first nMOS transistor whose gate is connected to a first input terminal and whose source is connected to a first constant voltage terminal via a first constant current source;

a second nMOS transistor whose gate is connected to a second input terminal and whose source is connected to the first constant voltage terminal via a second constant current source;

a first resistor which connects the sources of the first and second nMOS transistors;

a third nMOS transistor whose gate is connected to a first control terminal and whose source is connected to a drain of the first nMOS transistor;

a fourth nMOS transistor whose gate is connected to a second control terminal and whose source is connected to the drain of the first NMOS transistor;

a fifth nMOS transistor whose gate is connected to the second control terminal and whose source is connected to a drain of the second nMOS transistor;

a sixth nMOS transistor whose gate is connected to the first control terminal and whose source is connected to the drain of the second nMOS transistor;

a second resistor whose one terminal is connected in common to the drains of the third and fifth nMOS transistors and whose other terminal is connected to the second constant voltage terminal;

a third resistor whose one terminal is connected in common to the drains of the fourth and sixth nMOS transistors and whose other terminal is connected to the second constant voltage terminal;

a first pMOS transistor whose gate and source are connected to the second constant voltage terminal and whose drain is connected in common to the drains of the third and fifth NMOS transistors;

a second pMOS transistor whose gate is connected to a third control terminal, and whose source is connected to the second constant voltage terminal, and whose drain is connected in common to the drains of the fourth and sixth nMOS transistors;

a seventh nMOS transistor whose gate is connected to the drains of the third and fifth nMOS transistors, and whose drain is connected to the second constant voltage terminal, and whose source is connected to the first constant voltage terminal via a third constant current source;

an eighth NMOS transistor whose gate is connected to the drains of the fourth and sixth nMOS transistors, and whose drain is connected to the second constant voltage terminal, and whose source is connected to the first constant voltage terminal via a fourth constant current source;

a ninth nMOS transistor whose gate is connected to the source of the seventh nMOS transistor and whose source is connected to the first constant voltage terminal via a fifth constant current source;

a tenth nMOS transistor whose gate is connected to the source of the eighth nMOS transistor and whose source is connected to the first constant voltage terminal via a sixth constant current source;

a fourth resistor which connects the sources of the ninth and tenth nMOS transistors;

fifth and sixth resistors whose one terminals are connected to drains of the ninth and tenth nMOS transistors and whose other terminals are connected in common; and a parallel circuit of a seventh resistor and a first capacitor which connects a common terminal of the fifth and sixth resistors and the second constant voltage terminal, wherein the drains of the ninth and tenth nMOS transistors are set as first and second output terminals respectively, wherein, by potential difference of voltages to be applied to the first and second control terminals, phases of signals appearing in the first and second output terminals are inverted, and wherein, when voltages to be applied to the first and second control terminals are made equal and potential difference between DC voltage to be applied to the third control terminal and voltage of the second constant voltage terminal is set so as to exceed threshold voltage of the second PMOS transistor, signals appearing in the first and second output terminals become DC voltages of different values.

10. A frequency synthesizer comprising:

a single-tone signal generator which outputs signals of a single frequency;

a frequency multiplier which generates one or more intermediate signals having different frequencies based on frequencies of input signals and outputs the same as output signals, and controls output or output stop of the intermediate signal by a frequency multiplier control signal;

a frequency selector which includes one or more input terminals and outputs an input signal selected by a frequency selector control signal;

a mixer which performs frequency mixing to two input signals and generates an output signal; and a frequency synthesizer control circuit which includes a frequency synthesizer control terminal, wherein an output of the single-tone signal generator is set as an input of the frequency multiplier, wherein one or more outputs of the frequency multiplier are set as one or more inputs of the frequency selector, wherein an output of the frequency selector and one output of the outputs of the frequency multiplier are set as first and second inputs of the mixer, wherein an output of the mixer is set as an output of the frequency synthesizer, and wherein a frequency of the output signal of the single-tone signal generator is set as fREF, and by combining the control of the frequency selector by the selector control signal and the control of the mixer by the mixer output frequency control signal, signals of frequencies of fREF×(2n+1)/60 (herein n is an optional integer from 3 to 20) in a range of fREF from 7/60 to 41/60 are outputted.

11. The frequency synthesizer according to claim 10, wherein a frequency of the output signal of the single-tone signal generator is set at 15840 MHz, and by combining the control of the frequency selector by the selector control signal and the control of the mixer by the mixer output frequency control signal, output frequencies of, at least, 3432, 3960, 4488, 5016, 5544, 6072, 6600, 7128, 7656, 8184, 8712, 9240, 9768, 10296 (unit: MHz) are generated.

* * * * *